(12) United States Patent
Racz et al.

(10) Patent No.: US 7,545,136 B2
(45) Date of Patent: Jun. 9, 2009

(54) DEVICE FOR MEASURING CURRENT

(75) Inventors: Robert Racz, Zug (CH); Samuel Huber, Munich (DE); Markus Gloor, Adliswil (CH)

(73) Assignee: Melexis Technologies SA, Bevaix (CH)

( * ) Notice: Subject to any disclaimer, the term of this patent is extended or adjusted under 35 U.S.C. 154(b) by 0 days.

(21) Appl. No.: 11/653,627

(22) Filed: Jan. 16, 2007

(65) Prior Publication Data

US 2007/0164727 A1    Jul. 19, 2007

(30) Foreign Application Priority Data

| Jan. 19, 2006 | (CH) | ................................... | 00096/06 |
| May 8, 2006 | (CH) | ................................... | 00739/06 |
| Jun. 14, 2006 | (CH) | ................................... | 00985/06 |

(51) Int. Cl.
*G01R 15/20* (2006.01)
*G01R 15/08* (2006.01)

(52) U.S. Cl. ................. 324/117 H; 324/115; 324/117 R

(58) Field of Classification Search ............. 324/117 H, 324/115
See application file for complete search history.

(56) References Cited

U.S. PATENT DOCUMENTS

| 3,323,057 | A | * | 5/1967 | Haley ...................... 324/117 R |
| 3,344,347 | A | | 9/1967 | Stevens |
| 3,593,118 | A | * | 7/1971 | Chaney et al. ............... 324/442 |
| 3,800,193 | A | | 3/1974 | Ashar et al. .................. 317/235 |
| 4,361,805 | A | | 11/1982 | Narimatsu et al. ........... 324/207 |
| 4,749,939 | A | * | 6/1988 | Seitz ....................... 324/117 H |
| 5,717,327 | A | * | 2/1998 | Bradford .................... 324/142 |
| 5,942,895 | A | | 8/1999 | Popovic et al. .............. 324/251 |
| 6,184,679 | B1 | * | 2/2001 | Popovic et al. .............. 324/251 |
| 6,545,456 | B1 | | 4/2003 | Radosevich et al. ......... 324/117 |
| 7,129,691 | B2 | | 10/2006 | Shibahara et al. ........... 324/117 |
| 2002/0167301 | A1 | | 11/2002 | Haensgen et al. ........... 324/117 |
| 2003/0227285 | A1 | | 12/2003 | Marasch et al. ............. 324/117 |

FOREIGN PATENT DOCUMENTS

CH              659138              12/1986

(Continued)

OTHER PUBLICATIONS

Search Report for European Application No. EP 07 10 0349. May 3, 2007.

*Primary Examiner*—Ha Tran T Nguyen
*Assistant Examiner*—Karen M Kusumakar
(74) *Attorney, Agent, or Firm*—McCormick, Paulding & Huber LLP

(57) ABSTRACT

A device for measuring current comprises a magnetic field sensor for measuring the magnetic field produced by a current I flowing through a current conductor and a yoke of a magnetic material with a relative permeability of at least 100. The magnetic field sensor preferably comprises a semiconductor chip with at least one Hall element and an electronic circuit for the operation of the Hall element. The yoke consists of an oblong piece of sheet metal or a laminate of sheet metals with two ends, that has been brought by bending into a form in which the front sides of the ends of the yoke face each other and are separated by an air gap. The ends of the yoke may be flush, tapered, or flayed relative to the width of the yoke.

20 Claims, 5 Drawing Sheets

FOREIGN PATENT DOCUMENTS

Figure 1:
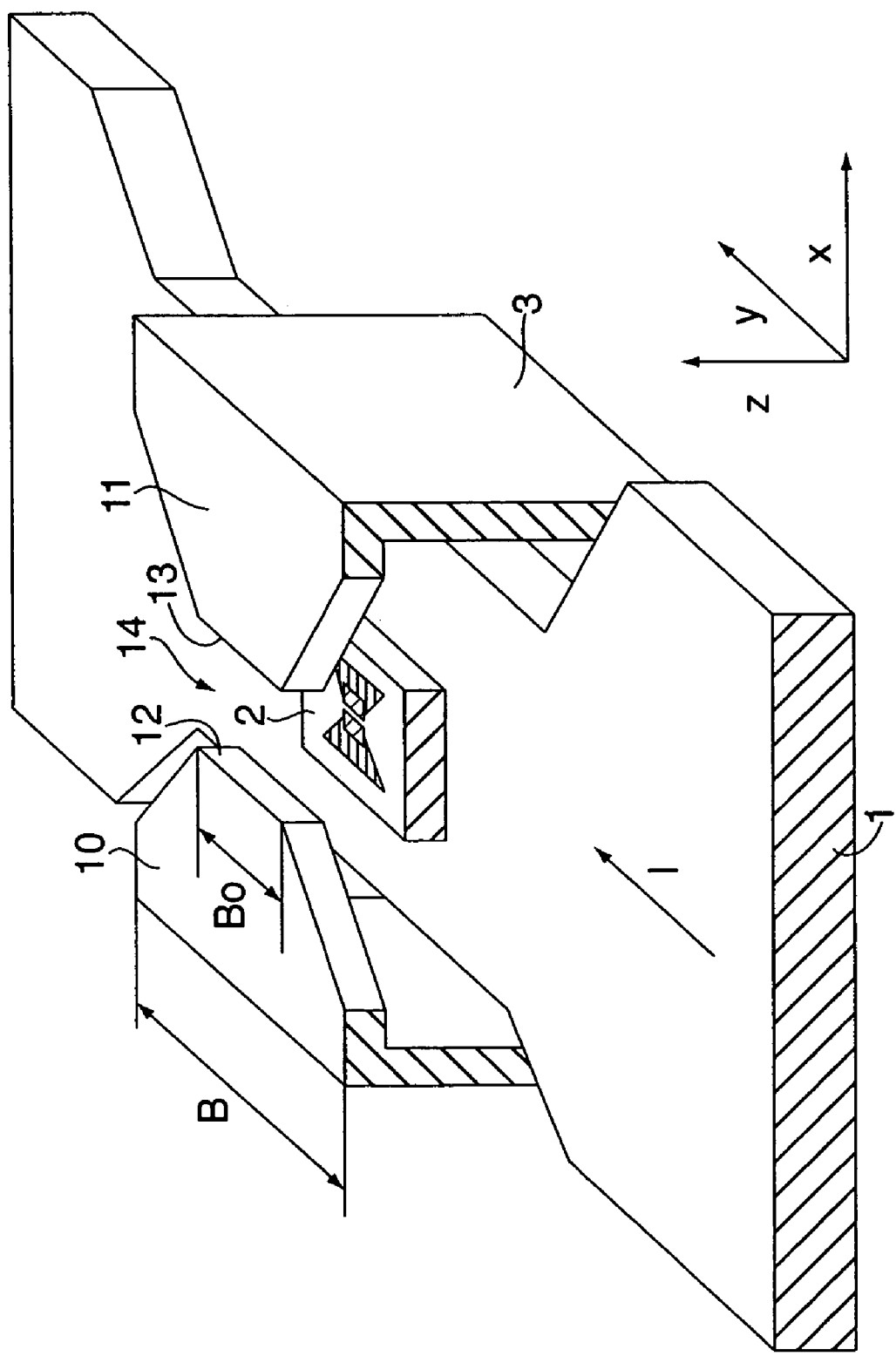

| | | |
|---|---|---|
| EP | 0 742 440 B1 | 5/1996 |
| EP | 0886147 A1 | 12/1998 |
| EP | 1 811 311 A1 | 1/2007 |
| JP | 62 98267 | 5/1987 |
| JP | 4 148870 | 5/1992 |
| JP | 6 130088 | 5/1994 |
| JP | 8 15322 | 1/1996 |

* cited by examiner

DEVICE FOR MEASURING CURRENT

PRIORITY CLAIM

Applicant hereby claims foreign priority under 35 U.S.C § 119 from Swiss Patent Application No. 96/06 filed Jan. 19, 2006, Swiss Patent Application No. 739/06 filed May 8, 2006 and Swiss Patent Application No. 985/06 filed Jun. 14, 2006, the disclosures of which are herein incorporated by reference.

FIELD OF THE INVENTION

The invention concerns a device for measuring current.

BACKGROUND OF THE INVENTION

Such a device for measuring current can also be designated as a current sensor, in particular then if it can be sold in the trade as a product consisting of one single component. Such a one-piece current sensor is known from U.S. Pat. No. 5,942, 895. The current sensor consists of a current conductor, a magnetic field sensor for measuring the magnetic field produced by a current flowing through the current conductor and a ferromagnetic yoke. The magnetic field sensor contains a semiconductor chip with two magnetic field concentrators arranged on the surface of the semiconductor chip that are separated by an air gap and two Hall elements integrated in the semiconductor chip that are arranged on both sides of the air gap so that magnetic field lines pass therethrough that issue from the first magnetic field concentrator in the vicinity of the air gap and impinge on the second magnetic field concentrator in the vicinity of the air gap. The semiconductor chip contains in addition the electronic circuits necessary for the operation of the Hall elements and the amplification and processing of the voltage signals delivered by the Hall elements. The magnetic field sensor is arranged on the current conductor so that the magnetic field lines created by the current run approximately parallel to the surface of the semiconductor chip and therefore also parallel to the magnetic field concentrators. The yoke borders the current conductor on three sides and forms together with the two magnetic field concentrators a nearly closed magnetic circuit. The yoke and the two magnetic field concentrators form a magnetic amplifier that amplifies the magnetic field produced by the current. Disadvantages of this current sensor are that because of its construction as current sensor with integrated current conductor it is only suited for measuring relatively small currents of up to 20 A and that external magnetic fields are hardly screened.

From CH 659 138 a device for measuring the current flowing in a current conductor is known with which a screen of magnetic material with high permeability screens magnetic stray fields.

SUMMARY OF THE INVENTION

The object of the invention is to develop a device for measuring current that can be designed in a simple way for the measurement of currents in a relatively small measurement range from 0 to typically 20 A or 50 A or also 100 A, as well as for the measurement of currents in a relatively big measuring range from 0 to 200 A or 300 A, that may be temporarily loaded with an overload current of up to 1000 A and that is well screened against external magnetic stray fields.

The device for measuring current according to the invention comprises a magnetic field sensor for the measurement of the magnetic field produced by a current flowing through a current conductor and a yoke of a magnetic material with high permeability that borders the current conductor in the measurement area. In principle the yoke consists of an oblong piece of sheet metal with two ends that has been brought by bending into a form with which the front faces lie opposite each other and are separated by an air gap. Therefore the yoke is like a piece of a tube with a slit running in the direction of the tube. With the exception of the air gap the yoke borders the current conductor completely.

The magnetic field sensor is preferably a magnetic field sensor with a Hall element integrated in a semiconductor chip and an electronic circuit integrated in the semiconductor chip for the operation of the Hall element and with two magnetic field concentrators arranged on the active surface of the semiconductor chip and separated by an air gap wherein field lines of the magnetic field pass through the Hall element that issue from the first magnetic field concentrator in the vicinity of the air gap and impinge on the second magnetic field concentrator in the vicinity of the air gap.

However, the magnetic field sensor may also be another sensor, e.g. an AMR (anisotropic magnetic resistance) or GMR (giant magnetic resistance) sensor or a fluxgate sensor.

The yoke serves on the one hand side for the amplification of the magnetic field produced by the current and on the other hand side for the screening of external magnetic stray fields. The magnetic field sensor and the yoke are adapted to each other such that the magnetic field sensor is only sensitive to a single component of the magnetic field, which is for example designated as x-component, and that the yoke screens exactly this x-component. Therefore the magnetic field sensor measures only the x-component of the magnetic field produced by the current flowing in the current conductor and does not measure the screened x-component of an external magnetic stray field. In order to achieve a high gain the ends of the yoke are tapered so that a width of the ends of the yoke is smaller than a width of the yoke. In addition the extension of the yoke in the direction to be screened (here in the x-direction) is at least as big as a height measured in thereto orthogonal direction. The screening can be further increased by an additional essentially u-shaped screen that borders the yoke on three sides.

The relation between the screening factor and the amplifying factor may be also enhanced in that the end of the yoke are either enlarged and/or are provided with a recess. A yoke of this form is also suited for the measurement of currents in a relatively big range from 0 to 200 A or 300 A, but also 1000 A.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

Figure 2:
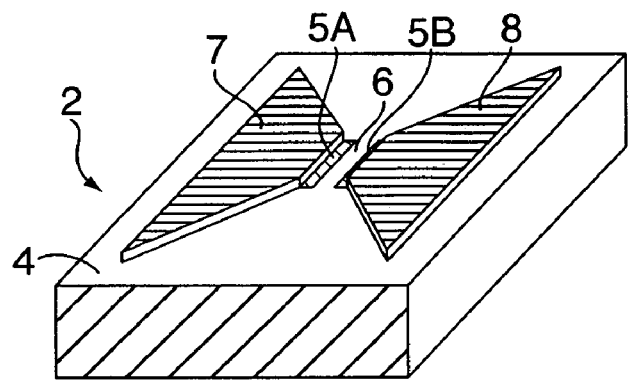
Figure 3:
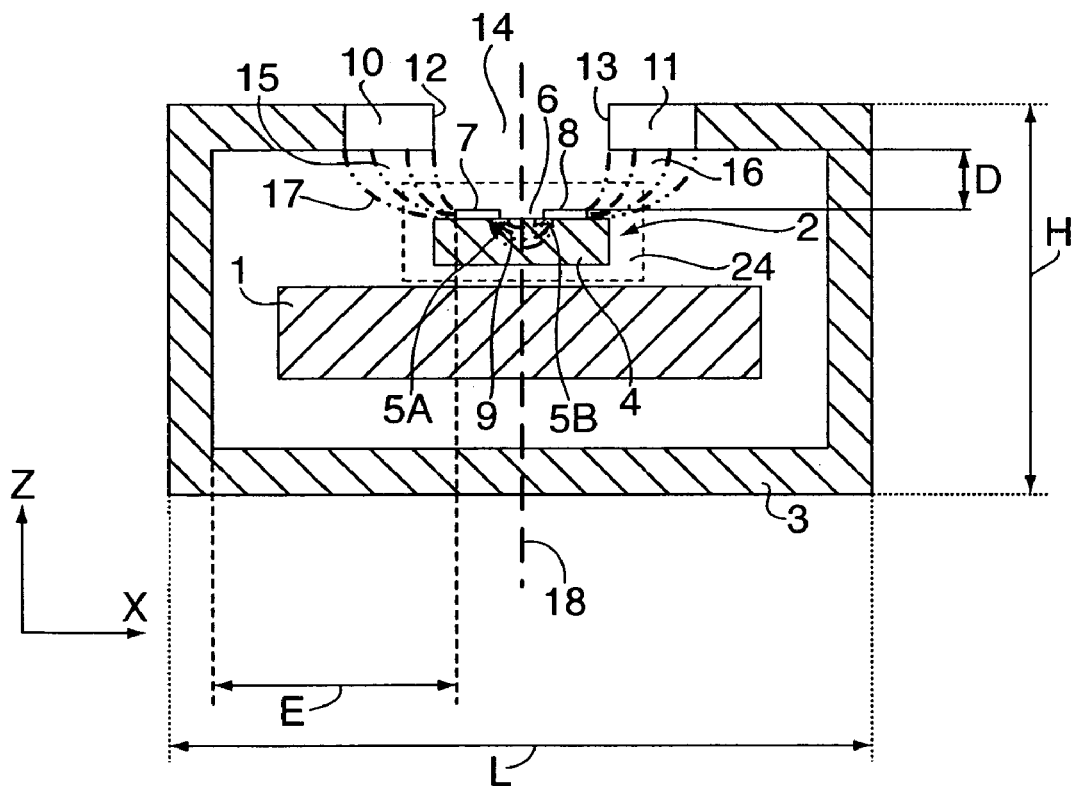
Figure 4:
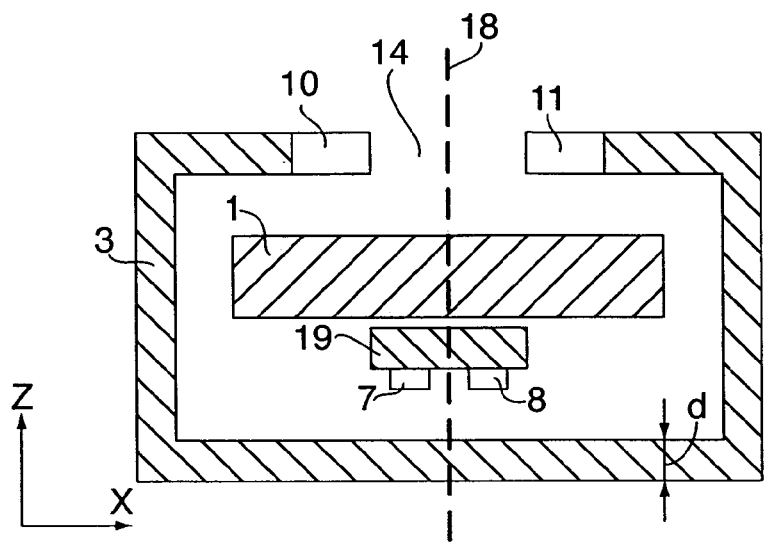
Figure 5:
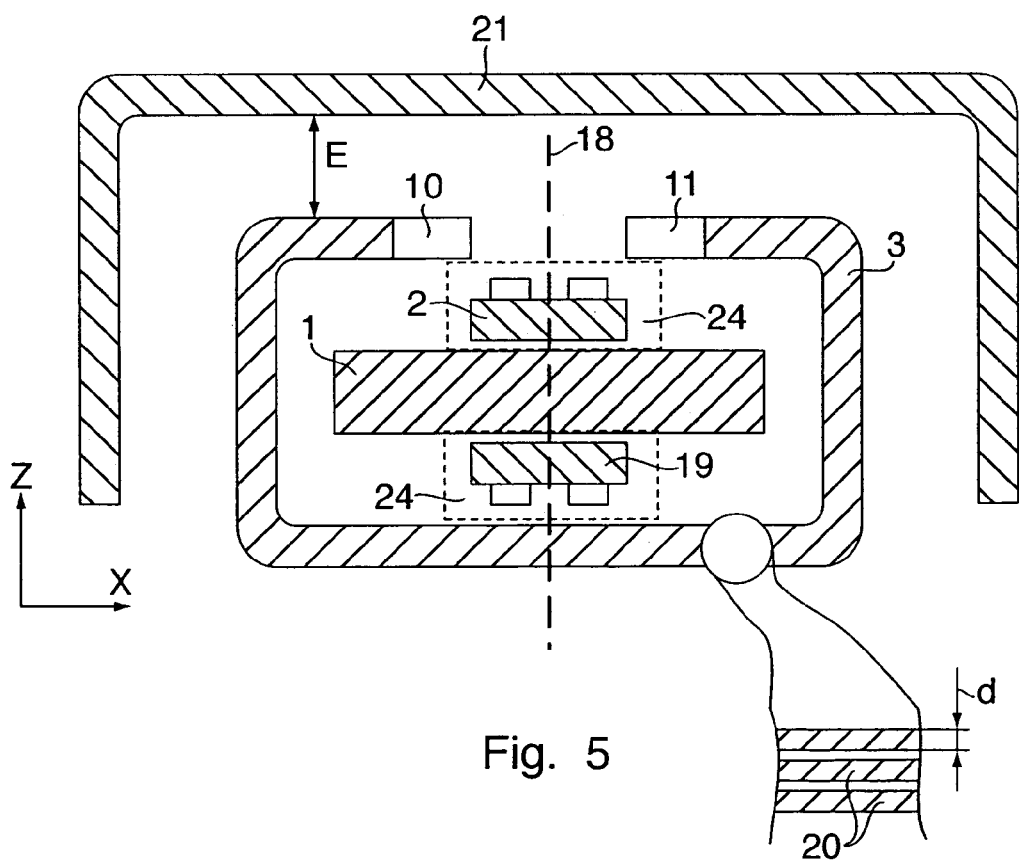
Figure 6:
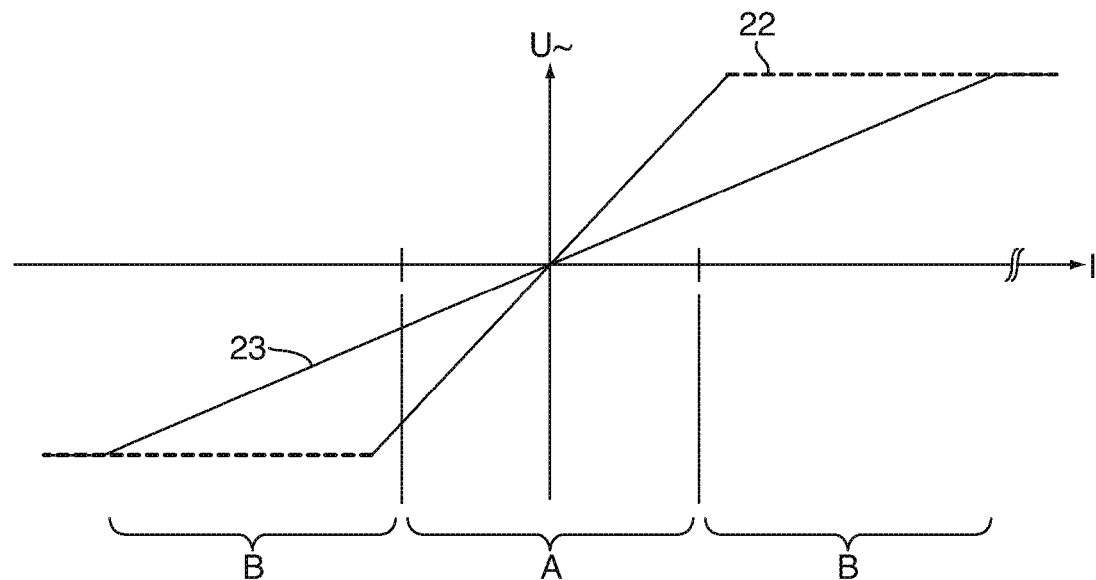
Figure 7:
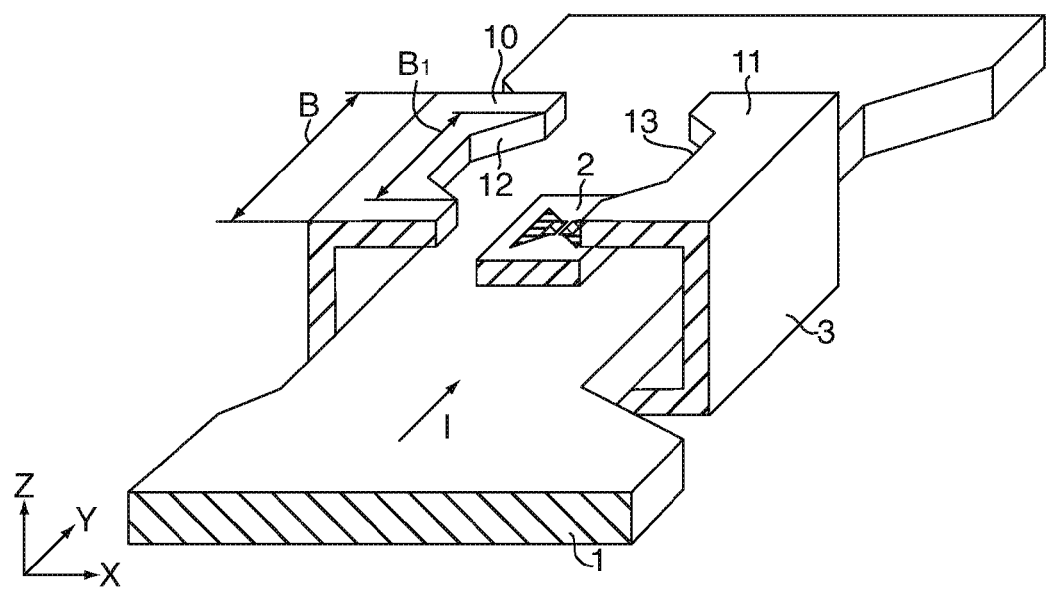
Figure 8:
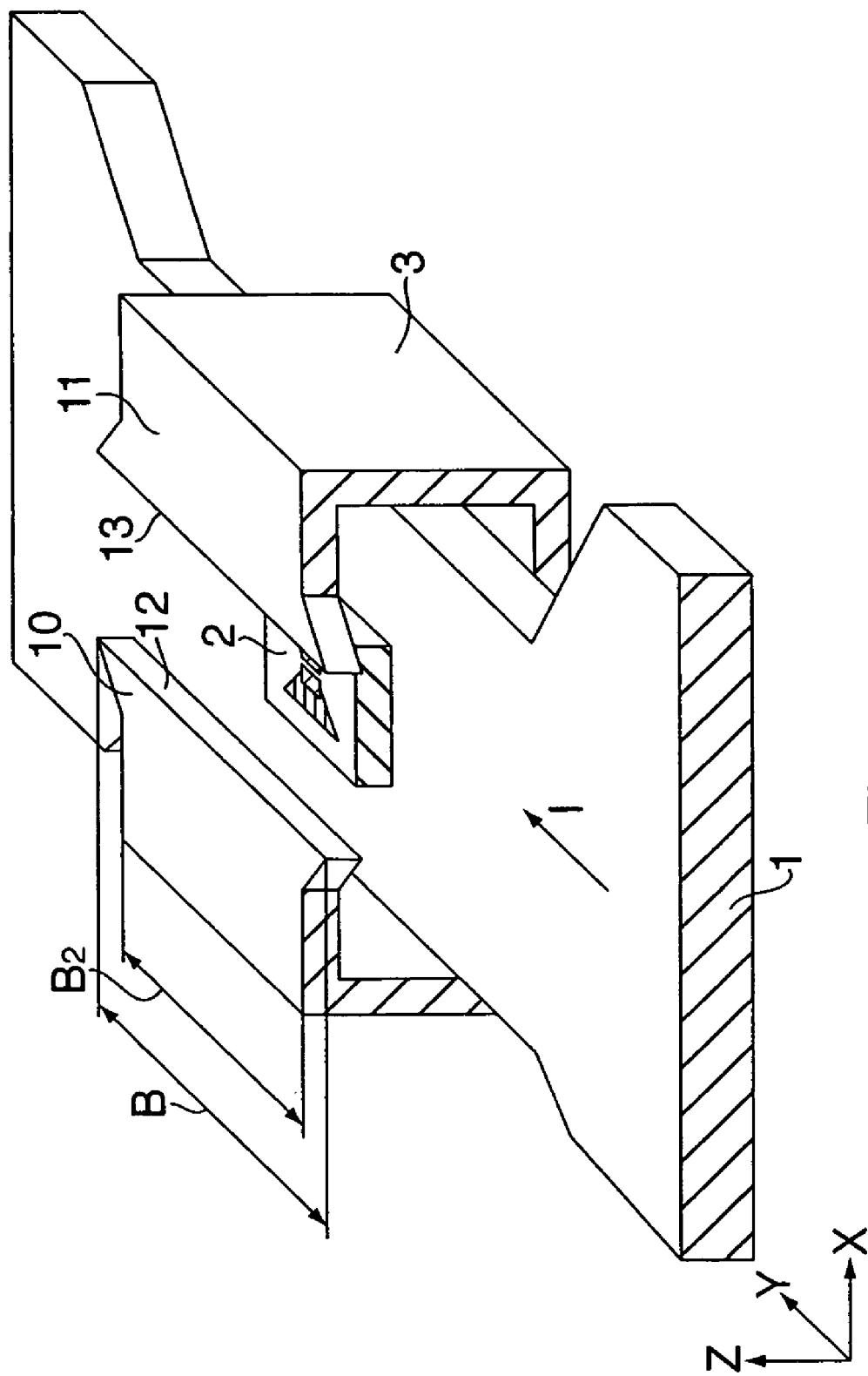

In the drawings:

FIG. 1 shows in a perspective view a device for the measurement of a current according to the invention with a magnetic field sensor and a yoke, FIG. 2 shows an embodiment of a preferred magnetic field sensor, FIG. 3 shows a cross-section of the device for measuring current, FIG. 4 shows a cross-section of a further device for measuring current, FIG. 5 shows a cross-section of a further device for measuring current, FIG. 6 shows output signals of the device for measuring current according to the embodiment of FIG. 5, and FIGS. 7, 8 show a perspective view of further devices for measuring current with the magnetic field sensor and the yoke.

DETAILED DESCRIPTION OF THE PREFERRED EMBODIMENTS

FIGS. 1 and 3 show a perspective view or cross-section, respectively, of a device for measuring the current I flowing through a current conductor 1, that in accordance with the invention is designed for the measurement of a current in the range from 0 to typically 20 A or 50 A, or about 100 A in the maximum. The cross-section of the current conductor 1 is preferably rectangular, but it may also have an arbitrary other shape, for example a round shape. The coordinates in a Cartesian coordinate system are designated with x, y and z. The current flows in the y-direction. The device for measuring current comprises a magnetic field sensor 2 that measures the magnetic field produced by the current I and a yoke 3 of a material with high magnetic permeability. High permeability means a relative permeability of at least 100 (the relative permeability of air is 1). The yoke 3 is formed for example from a piece of sheet metal of iron or Permalloy or Mumetal if this, that typically have a relative permeability in the range between 100 and 100,000. The yoke 3 is formed from an oblong piece of sheet metal with a thickness of about 0.5 to 2 mm with two ends 10 and 11 such that it nearly completely borders the current conductor 1, namely such that the two front faces 12 and 13 of the ends 10 and 11 of the sheet metal lie opposite each other and are separated by an air gap 14. The current conductor 1 and the magnetic field sensor 2 are completely located within the yoke 3. He ends 10 and 11 of the yoke 3 are tapered so that their width $B_0$ is less than the width B of the sheet metal or yoke 3. Preferably, the current conductor 1 is tapered in the area of the yoke 3.

A preferred example for the magnetic field sensor 2 is shown in more detail in FIG. 2: It contains a semiconductor chip 4 with at least one Hall element, in the example two Hall elements 5A and 5B, and electronic circuit for the operation of the at least one Hall element and the processing of the Hall voltage delivered by the at least one Hall element. On the active surface of the semiconductor chip 4, i.e. on the surface with the integrated circuits, two magnetic field concentrators 7, 8 separated by an air gap 6 are arranged such that field lines 9 of the magnetic field (see FIG. 3) that issue from the first magnetic field concentrator 7 in the vicinity of the air gap 6 and impinge on the second magnetic field concentrator 8 in the vicinity of the air gap 6 pass through the at least one Hall element. The structure of such a magnetic field sensor 2 is known from U.S. Pat. No. 5,942,895. The Hall element (or the two Hall elements 5A and 5B) is a so-called horizontal Hall element that is sensitive to a magnetic field that runs perpendicular to the active surface of the semiconductor chip 4, here therefore in z-direction. The term Hall element does not only mean a single Hall element, but it may comprise also a group of Hall elements connected parallel or antiparallel and/or operated with time multiplex. Such arrangements of Hall elements are used to reduce the offset of the Hall voltage. But the Hall element may also be a so-called vertical Hall element that is sensitive to a magnetic field that runs parallel to the active surface of the semiconductor chip 4 and perpendicular to the current direction, here therefore in x-direction.

The magnetic field sensor 2 is encapsulated in a housing 24. The magnetic field sensor 2 is (if no yoke 3 is present) sensitive to a magnetic field that runs in x-direction, and insensitive to magnetic fields that run in y- and z-direction. The two magnetic field concentrators 7 and 8 extend in x-direction. The housing 24 needs more space than is available in the air gap 14 of the yoke 3. The housing 24 is therefore located inside the yoke 3, but outside the air gap 14.

The air gap 14 present between the front faces 12 and 13 of the ends 10 and 11 of the yoke 3 is located "above" the air gap 6 between the two magnetic field concentrators 7 and 8, or, expressed geometrically: There exists a plane running perpendicular to the surface of the semiconductor chip 4 that runs through the air gap 6 as well as through the air gap 14. The yoke 3 and the two magnetic field concentrators 7 and 8 form thus a magnetic circuit interrupted through the air gap 6 and two further air gaps 15, 16 (see FIG. 3) wherein field lines 17 (see FIG. 3) of the magnetic field that issue from the first end 10 of the yoke 3 impinge on the first magnetic field concentrator 7, pass in the known manner through the air gap 6, leave the second magnetic field concentrator 8 and impinge on the second end 11 of the yoke 3. The device for measuring current is designed such that the two magnetic field concentrators 7 and 8 are not directly located in the air gap 14 of the yoke 3, but below the air gap 14, where they are essentially passed through by stray lines of the magnetic field that issue from the ends 10 and 11 of the yoke 3. In order to achieve this the distance D of the magnetic field sensor 2 to the air gap 14 of the yoke 3, as measured from the surface of the magnetic field concentrators 7 and 8, is preferably less than a distance E of the magnetic field sensor 2 to the sidewalls of the yoke 3, measured from the outer end of the magnetic field concentrators 7 and 8.

The yoke 3 performs two functions, namely on the one hand side the magnetic amplification of the magnetic field produced by the current flowing in the current conductor and on the other hand side the screening of the magnetic field sensor against external magnetic stray fields. Because of its construction the magnetic field sensor 2 is insensitive to external magnetic fields that are directed in y- and/or z-direction. The amplification of the magnetic field produced by the current flowing in the current conductor at the location of the Hall element is characterized by an amplification factor. The amplification factor depends on the geometry of the yoke 3, but also on the frequency of the current I. In the following the amplification factor usually designates the amplification factor at DC current or AC currents below a certain limit frequency $f_G$. The efficiency of the screening of the magnetic field sensor 2 against an external magnetic field directed in x-direction is characterized by a screening factor. The diminution of the ends 10 and 11 to the width $B_0$ has the effect to increase the amplification factor by the factor $B/B_0$ while the screening factor remains nearly unchanged. The amplification factor and the screening factor depend on the distance of the magnetic field sensor 2 to the air gap 14 between the ends 10 and 11 of the yoke 3. This situation is illustrated with the aid of FIG. 3 that shows a cross-section of the device for measuring current. The current conductor 1 and the yoke 3 have a rectangular cross-section and are arranged symmetrically in relation to a symmetry plane 18. The magnetic field sensor 2 is located on the side of the current conductor 1 facing the air gap 14 of the yoke 3 and is within mounting tolerances also placed symmetrically in relation to the symmetry plane 18 so that the symmetry plane 18 runs also through the air gap 6 between the two magnetic field concentrators 7 and 8. Die magnetic field concentrators 7 and 8 are located in the distance D to the air gap 14 of the yoke 3. The amplification factor of the yoke 3 decreases with increasing distance D because the proportion of the field lines 17 that issue from the one end 10 of the yoke 3 and arrive at the magnetic field concentrator 7 decreases with increasing distance D. Reversely, for the same reason the screening factor of the yoke 3 increases with increasing distance D. At a proper choice of the distance D the amplification factor typically amounts to about 10, the screening factor to about 100 to 1000.

In order that the screening of an external magnetic field running in x-direction is effective, a length L of the yoke 3 measured orthogonally to the current conductor 1 and parallel to the air gap 14 is at least the same size as a height H of the yoke 3 measured orthogonally to the air gap 14. Preferably the length L is bigger than the height H by at least a factor 1.5.

FIG. 4 shows a device for measuring current with which a magnetic field sensor 19 is placed on the side of the current conductor 1 not facing the air gap 14 of the yoke 3. The magnetic field sensor 19 is the same as the magnetic field sensor 2 of the previous example. The screening factor for the magnetic field sensor 19 is here also very big. The amplification factor of the yoke 3 for the magnetic field sensor 19, however, lies between 0 and 1, i.e. the yoke 3 does not amplify the magnetic field at the location of the second magnetic field sensor 19, but even reduces the magnetic field, if the amplification factor is smaller than 1. If the amplification factor is smaller than 1, this can be used in order to improve the frequency response of the magnetic field sensor 19. The output signal of the magnetic field sensor 19 without the yoke 3 as a function of the frequency of the current is constant in a frequency range from 0 to $f_{G1}$ ($f_{G1}$ amounts for example to 50 kHz) and then typically decreases with 20 dB/octave. The yoke 3 changes the frequency response, because the amplification factor of the yoke 3 also decreases above a limit frequency $f_{G2}$. If, however, the amplification factor of the yoke 3 for DC currents is already less than 1, then the damping of the amplification factor has less effect above the limit frequency $f_{G2}$ so that all in all the damping above the limit frequency $f_{G2}$ is reduced. This effect can be used in order to improve the frequency response of the current sensor. With the embodiment shown the yoke 3 consists of a single piece of sheet metal. The limit frequency $f_{G2}$ of the yoke 3 depends on the thickness d of the sheet metal:

$$f_{G2} \sim \frac{1}{d}$$

The thickness d of the sheet metal is now selected so that $f_{G2}$ is nearly equal to $f_{G1}$. With decreasing thickness of the sheet metal and therefore of the yoke 3 the magnetic field that magnetically saturates the yoke 3 gets smaller. In order to avoid this the yoke 3 is formed as a laminate of several sheet metals of the thickness d that are separated by an isolation layer. The thickness d of one metal sheet typically amounts to about 0.02 to 0.1, in the maximum 0.2 mm.

FIG. 5 shows a device for measuring current with which the magnetic field sensor 2 is arranged on the side of the current conductor 1 facing the air gap 14 of the yoke 3 and the magnetic field sensor 19 on the side of the current conductor 1 that does not face the air gap 14 of the yoke 3. The first magnetic field sensor 2 serves for a precise measurement of the current in a predefined working range from typically 0 to 50 A or 0 to 100 A, while the second magnetic field sensor 19 serves for the measurement of the current above the predefined working range, in a predefined overload range of here 50 A or 100 A to typically 1000 A. With this embodiment the yoke 3 is shown as a laminate from sheet metals 20 separated by isolating layers.

With all embodiments the screening factor can be increased by an additional, essentially u-shaped screen 21 of a material with high magnetic permeability that borders the yoke 3 on three sides. The screen 21 consists of three sections of which the middle section runs parallel to the air gap 14 of the yoke 3. The screen 21 preferably consists of the same material as the yoke 3. The screen 21 is placed at the distance E to the yoke 3. The distance E is chosen so big, that the screen 21 does not reduce or only insignificantly reduces the amplification factor of the yoke 3.

FIG. 6 shows the output signals 22 and 23 of the two magnetic field sensors 2 and 19 as a function of the current I flowing in the current conductor 1. The output signal 22 of the first magnetic field sensor 2 is proportional to the current I in the predefined working range A. Above the working range A saturation effects of the magnetic field concentrators 7, 8 of the first magnetic field sensor 2 occur that lead to a flattening of the output signal 22. The output signal 23 of the second magnetic field sensor 19 is proportional to the current I in the overload range B, because as a result of the smaller amplification factor saturation effects of the magnetic field concentrators 7, 8 of the second magnetic field sensor 19 occur only with currents above the upper limit of the overload range B.

The device for measuring current according to the invention is characterized by a simple and compact construction and a simple assembly. The housing 24 with the magnetic field sensor 2 can be glued directly on the current conductor 1. Alternatively, the housing 24 can be mounted on a printed circuit board and the printed circuit board can be fixed on the current conductor 1. Equally the yoke 3 can be glued on the opposite lying side directly or eventually with an additional distance keeping means to the current conductor 1.

The magnetic field sensor 2 or 19, respectively, should essentially be only sensitive to the x-component of an external magnetic field and insensitive to the y- and z-component of the external magnetic field. The magnetic field sensor with the two magnetic field concentrators and the Hall element described above fulfills these requirements to a high degree. The magnetic field sensor 2 or 19 may, however, with all embodiments also be another sensor that fulfills these requirements, for example an AMR (anisotropic magnetic resistance) or GMR (giant magnetic resistance) sensor. These sensors comprise a ferromagnetic resistive element, the electrical resistance of which depends on the strength of the magnetic field. The magnetic field sensor 2 or 19 may further be a fluxgate sensor. A fluxgate sensor comprises a ferromagnetic core. The ferromagnetic resistive element or the ferromagnetic core is arranged on the active surface of the semiconductor chip 4. The ferromagnetic resistive element or the ferromagnetic core influences the course of the magnetic field lines in a way similar to the magnetic field concentrators 7, 8 with the preceding embodiment.

Other, modified forms of the yoke are possible too. The two tapered ends of the yoke that lie opposite each other could for example also exist in the form of tongues punched free from the side walls of the yoke and bent.

FIG. 7 and FIG. 8 show in perspective view two devices for measuring current that are designed according to the invention for the measurement of currents in a bigger range from 0 to 200 A or 300 A. With these devices the ends of the yoke 3 are formed such that the magnetic field at the location of the magnetic field sensor 2 is smaller than with a device for measuring current with a yoke 3 the ends of which are neither tapered nor enlarged nor have a recess, which therefore have a straight front side with the width B. With the embodiment of FIG. 7 the ends 10 and 11 of the yoke 3 have the width B, but the front sides 12 and 13 of the yoke 3 are provided with a recess of the width $B_1$. With the embodiment of FIG. 8 the ends 10 and 11 of the yoke 3 are enlarged to the width $B_2$. A combination is also possible, i.e. an enlargement of the ends to the width $B_2 > B$ and the formation of a recess of the width $B_1$. Thus the amplification factor of the yoke 3 is significantly reduced, while the screening factor changes insignificantly. In doing so on the one hand side the ratio of the screening factor to the amplification factor can be augmented and on the other hand side the amplification factor diminished.

The shown embodiments illustrate that the device for measuring current can be designed for the measurement of variably big maximum currents solely by changing the form of the ends of the yoke 3. The same magnetic field sensor 2 can be mounted in the same way and at the same position on the current conductor 1.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A device for measuring current, comprising a magnetic field sensor for measuring a magnetic field produced by a current flowing through a current conductor, the magnetic field sensor encapsulated into a housing, and a yoke, wherein the yoke is formed of an oblong piece of sheet metal of a magnetic material with a relative permeability of at least 100 such that it has a bottom side, two sidewalls and a top side, the top side running parallel to the bottom side and having an air gap formed between two ends with front sides that face each other across the air gap, wherein the yoke completely circumscribes the current conductor with the exception of the air gap, wherein the housing with the magnetic field sensor is placed inside the yoke and outside the air gap of the yoke, wherein the magnetic field sensor is placed at a first distance from the air gap and at a second distance from the sidewalls of the yoke, wherein the first distance is less than the second distance so that the magnetic field sensor is essentially passed through by stray lines of the magnetic field that issue from the ends of the yoke, and wherein a length of the yoke measured at a right angle to the direction of the current flowing in the current conductor and parallel to the air gap of the yoke is at least the same size as a height of the yoke measured at a right angle to the direction of the current flowing in the current conductor and perpendicular to the air gap.

2. The device of claim 1, wherein the ends of the yoke are tapered.

3. The device of claim 1, wherein the ends of the yoke are enlarged or provided with a recess or are enlarged and provided with a recess.

4. The device of claim 1, wherein the magnetic field sensor comprises a semiconductor chip with at least one Hall element and two magnetic field concentrators separated by a further air gap are arranged on a surface of the semiconductor chip, wherein field lines of the magnetic field that issue from the first magnetic field concentrator in the vicinity of the further air gap and impinge on the second magnetic field concentrator in the vicinity of the further air gap pass through the at least one Hall element.

5. The device of claim 2, wherein the magnetic field sensor comprises a semiconductor chip with at least one Hall element and two magnetic field concentrators separated by a further air gap are arranged on a surface of the semiconductor chip, wherein field lines of the magnetic field that issue from the first magnetic field concentrator in the vicinity of the further air gap and impinge on the second magnetic field concentrator in the vicinity of the further air gap pass through the at least one Hall element.

6. The device of claim 3, wherein the magnetic field sensor comprises a semiconductor chip with at least one Hall element and two magnetic field concentrators separated by a further air gap are arranged on a surface of the semiconductor chip, wherein field lines of the magnetic field that issue from the first magnetic field concentrator in the vicinity of the further air gap and impinge on the second magnetic field concentrator in the vicinity of the further air gap pass through the at least one Hall element.

7. A device for measuring current, comprising a magnetic field sensor for measuring a magnetic field produced by a current flowing through a current conductor, the magnetic field sensor encapsulated into a housing, and a yoke, wherein the yoke is formed of an oblong piece of sheet metal of a magnetic material with a relative permeability of at least 100 such that it has a bottom side, two sidewalls and a top side, the top side running parallel to the bottom side and having an air gap formed between two ends with front sides that face each other across the air gap, wherein the yoke completely circumscribes the current conductor with the exception of the air gap, wherein the housing with the magnetic field sensor is placed inside the yoke and outside the air gap of the yoke, wherein the magnetic field sensor is placed at a first distance from the air gap and at a second distance from the sidewalls of the yoke, wherein the first distance is less than the second distance so that the magnetic field sensor is essentially passed through by stray lines of the magnetic field that issue from the ends of the yoke, and wherein a length of the yoke measured at a right angle to the direction of the current flowing in the current conductor and parallel to the air gap of the yoke is at least the same size as a height of the yoke measured at a right angle to the direction of the current flowing in the current conductor and perpendicular to the air gap, wherein the magnetic field sensor is placed on a side of the current conductor facing the air gap of the yoke, and wherein a further magnetic field sensor is placed on a side of the current conductor that does not face the air gap of the yoke.

8. The device of claim 7, wherein the ends of the yoke are tapered.

9. The device of claim 7, wherein the ends of the yoke are enlarged or provided with a recess or are enlarged and provided with a recess.

10. The device of claim 7, wherein the magnetic field sensor comprises a semiconductor chip with at least one Hall element and two magnetic field concentrators separated by a further air gap are arranged on a surface of the semiconductor chip, wherein field lines of the magnetic field that issue from the first magnetic field concentrator in the vicinity of the further air gap and impinge on the second magnetic field concentrator in the vicinity of the further air gap pass through the at least one Hall element, and wherein a further magnetic field sensor is placed on a side of the current conductor that does not face the air gap of the yoke.

11. The device of claim 10, wherein the ends of the yoke are tapered.

12. The device of claim 10, wherein the ends of the yoke are enlarged or provided with a recess or are enlarged and provided with a recess.

13. The device of claim 1, further comprising an essentially u shaped screen of a magnetic material with a relative permeability of at least 100 that borders the yoke on three sides, wherein the screen has three sections of which the middle section runs adjacent the air gap and parallel to the air gap of the yoke.

14. The device of claim 2, further comprising an essentially u shaped screen of a magnetic material with a relative permeability of at least 100 that borders the yoke on three sides, wherein the screen has three sections of which the middle section runs adjacent the air gap and parallel to the air gap of the yoke.

15. The device of claim 3, further comprising an essentially u shaped screen of a magnetic material with a relative permeability of at least 100 that borders the yoke on three sides, wherein the screen has three sections of which the middle section runs adjacent the air gap and parallel to the air gap of the yoke.

16. The device of claim 4, further comprising an essentially u shaped screen of a magnetic material with a relative permeability of at least 100 that borders the yoke on three sides, wherein the screen has three sections of which the middle section runs adjacent the air gap and parallel to the air gap of the yoke.

17. The device of claim 7, further comprising an essentially u shaped screen of a magnetic material with a relative permeability of at least 100 that borders the yoke on three sides, wherein the screen has three sections of which the middle section runs adjacent the air gap and parallel to the air gap of the yoke.

18. The device of claim 8, further comprising an essentially u shaped screen of a magnetic material with a relative permeability of at least 100 that borders the yoke on three sides, wherein the screen has three sections of which the middle section runs adjacent the air gap and parallel to the air gap of the yoke.

19. A device for measuring current, comprising a magnetic field sensor for measuring a magnetic field produced by a current flowing through a current conductor, the magnetic field sensor encapsulated into a housing, and a yoke, wherein the yoke is formed of an oblong piece of sheet metal of a magnetic material with a relative permeability of at least 100 such that it has a bottom side, two sidewalls and a top side, the top side running parallel to the bottom side and having an air gap formed between two ends with front sides that face each other across the air gap, wherein the yoke completely circumscribes the current conductor with the exception of the air gap, wherein the housing with the magnetic field sensor is placed inside the yoke and outside the air gap of the yoke, and wherein a length of the yoke measured at a right angle to the direction of the current flowing in the current conductor and parallel to the air gap of the yoke is at least the same size as a height of the yoke measured at a right angle to the direction of the current flowing in the current conductor and perpendicular to the air gap and wherein the magnetic field sensor is placed on the side of the current conductor that does not face the air gap of the yoke.

20. The device of claim 19, further comprising an essentially u shaped screen of a magnetic material with a relative permeability of at least 100 that borders the yoke on three sides, wherein the screen has three sections of which the middle section runs adjacent the air gap and parallel to the air gap of the yoke.

* * * * *